United States Patent
Hassel

(10) Patent No.: US 12,362,748 B2
(45) Date of Patent: Jul. 15, 2025

(54) MICROWAVE POWER SOURCE, AND A METHOD FOR GENERATING MICROWAVE SIGNALS

(71) Applicant: IQM FINLAND OY, Espoo (FI)

(72) Inventor: Juha Hassel, Espoo (FI)

(73) Assignee: IQM FINLAND OY, Espoo (FI)

( * ) Notice: Subject to any disclaimer, the term of this patent is extended or adjusted under 35 U.S.C. 154(b) by 0 days.

(21) Appl. No.: 18/288,317

(22) PCT Filed: Jun. 1, 2021

(86) PCT No.: PCT/FI2021/050398
§ 371 (c)(1),
(2) Date: Oct. 25, 2023

(87) PCT Pub. No.: WO2022/254077
PCT Pub. Date: Dec. 8, 2022

(65) Prior Publication Data
US 2024/0204778 A1    Jun. 20, 2024

(51) Int. Cl.
*H03K 17/92* (2006.01)

(52) U.S. Cl.
CPC .................................. *H03K 17/92* (2013.01)

(58) Field of Classification Search
CPC ..................................................... H03K 17/92
USPC ........................................................ 327/528
See application file for complete search history.

(56) References Cited

U.S. PATENT DOCUMENTS 5,191,236 A * 3/1993 Ruby .................... H03B 15/00
                                                        331/107 S
5,565,866 A    10/1996 Hamilton et al.

FOREIGN PATENT DOCUMENTS

EP    0467104 A2    1/1992
EP    3217336 A1    9/2017

OTHER PUBLICATIONS

International Search Report and Written Opinion issued in PCT/FI2021/050398, mailed Feb. 3, 2022.
International Preliminary Report on Patentability issued in PCT/FI2021/050398, mailed Apr. 21, 2023.

* cited by examiner

*Primary Examiner* — Tomi Skibinski
(74) *Attorney, Agent, or Firm* — Meunier Carlin & Curfman LLC

(57) ABSTRACT

A microwave power source comprises a Josephson junction or junction array and a resonant tank circuit coupled thereto and configured to resonate at one or more frequencies of Josephson oscillation. An output coupler is coupled to said resonant tank circuit for outputting microwave power from said resonant tank circuit. A bias circuit is coupled to the Josephson junction and configured to produce a bias voltage across the Josephson junction. Said bias circuit comprises a current path of variable resistance between a bias input of the microwave power source and a reference potential.

13 Claims, 5 Drawing Sheets

MICROWAVE POWER SOURCE, AND A METHOD FOR GENERATING MICROWAVE SIGNALS

CROSS REFERENCE TO RELATED APPLICATIONS

The application is a U.S. National Stage application filed under 35 U.S.C. § 371 of PCT/FI2021/050398, filed on Jun. 1, 2021.

FIELD OF THE INVENTION

The invention is related to the technical field of generating microwave, millimetre wave, and/or submillimetre wave signals for use in quantum computing circuits. In particular, the invention is related to the use of a Josephson oscillator as the source of such signals at a high efficiency.

BACKGROUND OF THE INVENTION

Quantum computing and other applications of cryogenically cooled electronic circuits benefit greatly from the capability of generating microwave, millimetre wave, and/or sub-millimetre wave signals within the cryogenically cooled environment, instead of having to bring in such signals from the surrounding room temperature environment. A circuit element capable of generating such signals is often referred to as a microwave power source for short, even if the actual generated signals may be in the millimetre or sub-millimetre wave range.

A known microwave power source capable of operation at sub-kelvin temperatures is the Josephson oscillator, the basic element of which is a Josephson junction (or array of Josephson junctions) connected in parallel with a resonant tank circuit. The Josephson junction may be capacitively shunted with an external capacitance to ensure stable oscillator operation, but this is not necessary, depending somewhat on the junction parameters. In the preferred mode of operation, the Josephson dynamics is injection locked to the tank circuit resonance, which is in turn weakly coupled to the signal output. In addition, there may be a bias circuit.

FIG. 1 illustrates schematically one example of a Josephson oscillator, and FIG. 2 shows the same in a simplified circuit diagram. In this example, an external capacitance is used as a capacitive shunt. The Josephson junction 201 and capacitive shunt 202 of FIG. 2 are included in the Josephson junction (s) block 101 of FIG. 1. The resonant tank circuit 102 is the same in both drawings. The output coupler 103 is schematically shown as a capacitive coupler in FIG. 2. The bias circuit is called a biasing stabilizer 104 in FIG. 1, and it consists of the series coupling of an inductor 203 and a resistor 204 in FIG. 2. The role of the inductor 203 is to act as a low-pass filter that blocks the undesirable dissipation of the generated microwave radiation. A DC bias current $I_B$ flowing through the resistor 204 makes a stable bias voltage appear across the capacitively shunted Josephson junction 201.

It may be noted that also other kinds of Josephson oscillators are known. The topology shown in FIG. 2 is considered here as an example, but the discussion in this text is straightforwardly applicable to also other kinds of Josephson oscillators.

A drawback of the known Josephson oscillators is their relatively modest efficiency in converting DC power into microwave power. With a Josephson oscillator of the kind shown in FIGS. 1 and 2 a DC-to-microwave conversion efficiency of 15% has been observed, while the remaining 85% is dissipated as heat. In a macroscopic aspect the power dissipation loads the cooling capacity of the cryostat, which may become a problem especially when quantum computers scale up from the experimental systems with only a handful of oscillators towards projected future systems where tens of thousands of microwave power sources may be needed. Another problem, which may be more immediate also in smaller systems, is local heating. With relatively rough calculations it may be shown that a total dissipated power in the order of 200 pW may give rise to an electron temperature in the order of hundreds of mK in the biasing resistor. This is a very high temperature compared to the typical base temperatures in the order of 10 mK that are achieved in dilution-refrigerator-based cryostats. Local heating in this magnitude may have a significant negative impact on signal quality, potentially limiting the oscillation linewidth and phase-noise properties. The local heating may also become a problem in control systems densely integrated with the qubits.

SUMMARY

It is an objective to present a method and an arrangement for converting DC power into microwave, millimetre wave, and/or sub-millimetre wave signals at high efficiency.

According to a first aspect, there is provided a microwave power source that comprises a Josephson junction or junction array, referred to in the continuation as the Josephson junction, and a resonant tank circuit coupled to the Josephson junction and configured to resonate at one or more frequencies of Josephson oscillation generated in the Josephson junction. The microwave power source comprises an output coupler coupled to said resonant tank circuit for outputting microwave power from said resonant tank circuit, and a bias circuit coupled to the Josephson junction and configured to produce a bias voltage across the Josephson junction. Said bias circuit comprises a current path of variable resistance between a bias input of the microwave power source and a reference potential.

According to an embodiment, the bias circuit comprises a control input, separate from said bias input, and the bias circuit comprises a controllable resistive element on said current path, a resistance of said controllable resistive element being responsive to the value of a control signal brought to said control input. This involves the advantage that an accurate response of the variable resistance to a control signal can be provided.

According to an embodiment said control input is a control voltage input. The controllable resistive element may then comprise one or more transistors, each with a respective current-carrying channel between respective two current-carrying electrodes and with a respective control electrode coupled to said control voltage input. A potential of the control electrode then defines the resistance of said current-carrying channel in each of said one or more transistors. This involves the advantage that accurate response of the variable response can be provided without having to make any currents of significant magnitude to flow in the control line.

According to an embodiment, each of said one or more transistors is one of: a field-effect transistor, a junction field-effect transistor, a metal-oxide semiconductor field-effect transistor, a high electron mobility transistor, a bipolar junction transistor, a single-electron transistor, a single Cooper pair transistor. This involves the advantage that the bias circuit can be made controllable with circuit elements the manufacturing and behaviour in use are well known.

According to an embodiment, said control input is a control current input. The controllable resistive element may then be a SQUID or SQUID array on said current path, a critical current of said SQUID or SQUID array being responsive to the value of control current brought to said control current input. This involves the advantage that the bias circuit does not necessitate manufacturing stages that would differ very much from those that are needed to manufacture other parts of the microwave power source.

According to an embodiment the microwave power source comprises a series resistance coupled in series with said one or more transistor, SQUID, or SQUID array on said current path. This involves the advantage that a guaranteed minimum resistance value can be provided.

According to an embodiment, the resistance of said current path is responsive to the value of a bias signal or component of a bias signal brought to said bias input. This involves the advantage that fewer control lines are needed.

According to an embodiment, said current path comprises a SQUID or SQUID array, and the microwave power source comprises, coupled between said bias input and said Josephson junction, an inductance inductively coupled to said SQUID or SQUID array. This involves the advantage that the way in which a bias current adjusts the variable resistance value can be accurately designed.

According to an embodiment, the microwave power source comprises a nonlinear resistive element on said current path, said nonlinear resistive element having a resistance that is inversely dependent of the value of current therethrough. This involves the advantage that space is saved because less inductive elements are needed.

According to an embodiment, said nonlinear resistive element comprises at least one of: diode, diode-connected transistor, tunnel junction containing at least one superconducting electrode. This involves the advantage that the bias circuit can be made adaptable with circuit elements the manufacturing and behaviour in use are well known.

According to an embodiment said nonlinear resistive element comprises at least one of: a normal metal-insulator-superconductor junction, a superconductor-insulator-normal metal-insulator-superconductor junction. This involves the advantage that the bias circuit can be made adaptable with circuit elements the manufacturing and behaviour in use are well known.

According to a second aspect, there is provided a method for generating microwave signals. The method comprises biasing a Josephson oscillator to an operating point on an original Shapiro step with an upwards sweep of bias current brought to a bias input of the Josephson oscillator, and subsequently increasing a resistance on a current path used for said biasing, causing said operating point to migrate onto an extension of said original Shapiro step at smaller bias current values. The method further comprises utilizing Josephson oscillations coupled out of a resonant tank circuit of said Josephson oscillator as the generated microwave signal.

According to an embodiment, said increasing of said resistance is accomplished by changing the value of a control signal brought to a controllable resistance on said current path. This involves the advantage that an accurate response of the variable resistance to a control signal can be provided.

According to an embodiment, said increasing of said resistance is accomplished by changing the value of a bias current used for said biasing. This involves the advantage that fewer control lines are needed.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 3:
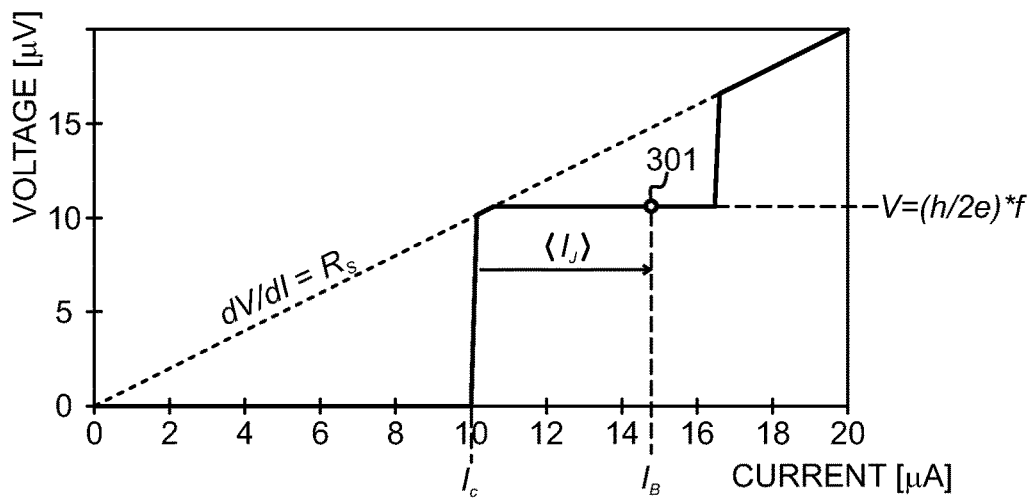
FIG. 3 illustrates an I-V curve related to the biasing of a Josephson oscillator.

In order to improve the efficiency of a Josephson oscillator used as a microwave power source it is illustrative to begin with the I-V curve of FIG. 3. It illustrates the voltage (in microvolts) across an exemplary Josephson junction (or junction array) as a function of the bias current $I_B$. As pointed out above, the Josephson junction or junction array may be capacitively shunted, but this is not an essential requirement.

The dashed line represents the simple Ohmic relation $dV/dI=R_S$. There is a critical current value $I_c$, which here is about 10 microamperes, at which a proper bias voltage appears. Increasing the bias current from $I_c$ leads to the so-called (first) Shapiro step at voltage $V=(h/2e)f$, where h is the Planck constant, e is the electron charge, and f is the frequency of the generated microwave signal. For bias points on the Shapiro step, such as the exemplary point 301 in FIG. 1, the total DC input power $P_{in}$ can be written as $$P_{in} = I_B V = \frac{hf}{2e} I_B. \tag{1}$$

The microwave power generation in the Josephson oscillator can be described through a negative high-frequency dynamic resistance $$R_d = -\frac{hf\langle I_J\rangle}{eI_1^2}, \quad (2)$$

where $I_1$ is the amplitude of the high-frequency (much higher than the junction plasma frequency) current through the Josephson junction. The total microwave power generation $P_{gen}$ is $$P_{gen} = -\frac{1}{2}R_d I_1^2 = \frac{hf\langle I_J\rangle}{2e} \quad (3)$$

and using the definitions marked in FIG. 3 it can be written that $$\langle I_J\rangle = I_B - \frac{(h/2e)f}{R_S}. \quad (4)$$

This allows rewriting the generated power $P_{gen}$ as $$P_{gen} = \frac{hf}{2e}\left(I_B - \frac{(h/2e)f}{R_S}\right). \quad (5)$$

Defining the generation efficiency as limited by DC dissipation, the efficiency η can be defined and written as $$\eta = \frac{P_{gen}}{P_{in}} = 1 - \frac{hf}{2eR_s I_B}. \quad (6)$$

Figure 2:
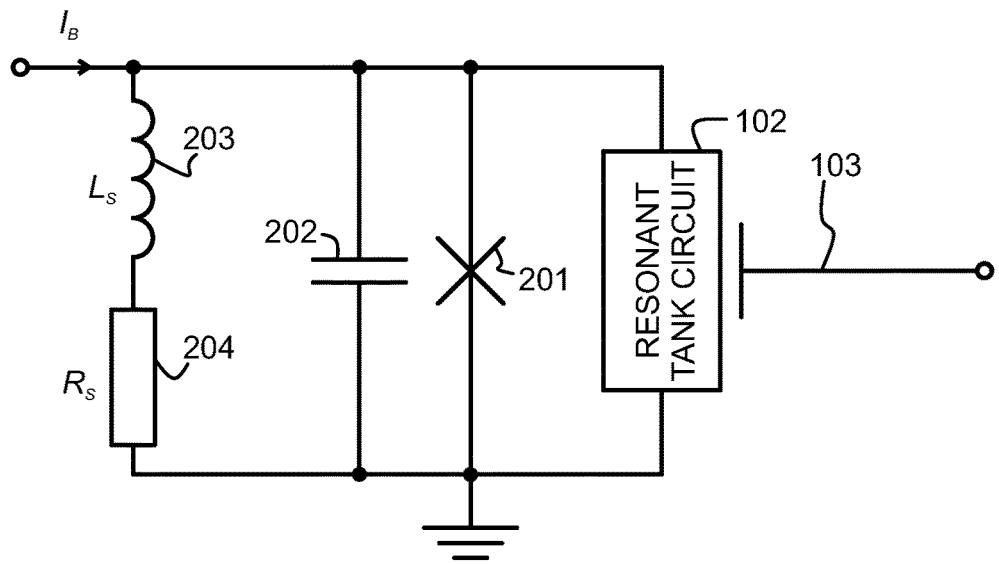
FIG. 2 is a schematic circuit diagram of the Josephson oscillator of FIG. 1.

In light of equation (6), a natural choice for maximizing efficiency would seem to be to make $R_S$ as large as possible. This is also intuitive when looking at the circuit diagram of FIG. 2, because increasing the DC resistance on the current path between the bias current input and ground should make the current flowing therethrough (and consequently the power P=UI dissipated in the biasing resistor) smaller.

Using the values f=5.16 GHZ, $I_B$=14 µA, and $R_S$=1.0Ω gives an efficiency η of about 25%. These values were used in the simulation resulting in the graph of FIG. 3, which is reproduced as the upper graph (a) in FIG. 4 with the addition of the hysteresis observed with a downwards current sweep. The hysteresis is illustrated with the arrowheads along the various sections of the graph. Increasing $R_S$ to 10Ω would bring the efficiency η up to 92%. However, according to the simulation, changing $R_S$ to 10Ω while keeping everything else the same results in what is shown in the lower graph (b) of FIG. 4. The Shapiro step is not reached at all, meaning that successful biasing of the Josephson junction is not possible with such a large biasing resistor.

Figure 5:
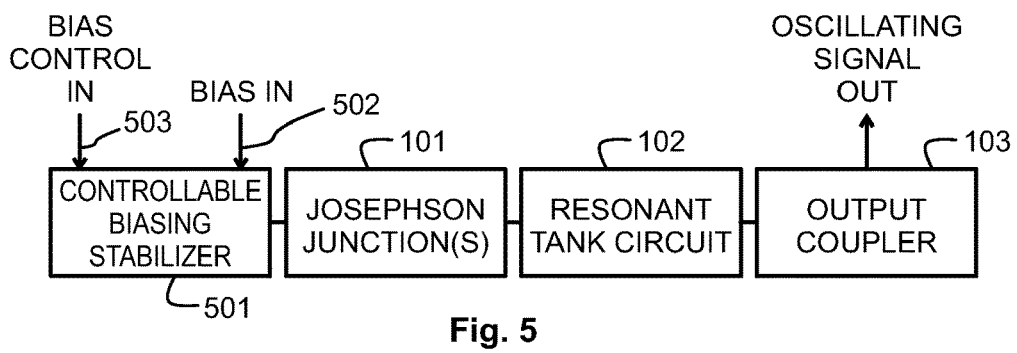
FIG. 5 illustrates a Josephson oscillator according to an embodiment.

FIG. 5 illustrates schematically a microwave power source in which the problems above have been solved to a large extent. Similar to FIG. 1, the microwave power source of FIG. 5 comprises a Josephson junction or junction array 101 and a resonant tank circuit 102. Irrespective of the number of Josephson junctions in block 101 it is called just a Josephson junction in the continuation for short. The resonant tank circuit 102 is coupled to the Josephson junction 101 and configured to resonate at one or more frequencies of Josephson oscillation that will be generated in the Josephson junction 101 under a suitable bias.

Figure 1:
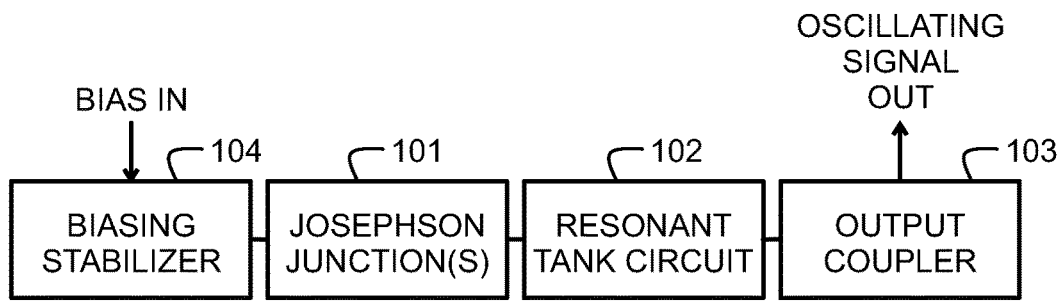
FIG. 1 illustrates a Josephson oscillator.

Also similar to FIG. 1, the microwave power source of FIG. 5 comprises an output coupler 103 coupled to the resonant tank circuit 102 for outputting microwave power from the resonant tank circuit 102. As a superficial similarity, there is a bias circuit 501 coupled to the Josephson junction 101 and configured to produce a bias voltage across the Josephson junction 101. However, as an important difference, the bias circuit 501 (or biasing stabilizer) is controllable in FIG. 5. It comprises a current path of variable resistance between a bias input 502 of the microwave power source and a reference potential.

Figure 6:
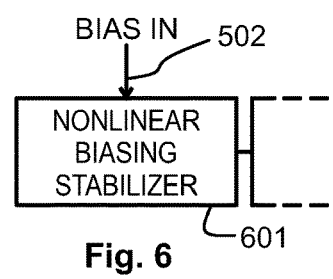
FIG. 6 illustrates a possible variation to the Josephson oscillator of FIG. 5.

In FIG. 5 the bias circuit 501 comprises a control input 503, separate from the bias input 502. Later in this description there are examples how such a bias circuit may comprise a controllable resistive element on said current path, so that the resistance of such a controllable resistive element is responsive to the value of a control signal brought to the control input 503. FIG. 6 illustrates an alternative bias circuit 601, called here a nonlinear biasing stabilizer, which does not have a separate control input. In the embodiment of FIG. 6, a resistance of the appropriate current path in the bias circuit 601 is responsive to the value of a bias signal (or a component thereof) brought to the bias input 502.

Figure 7:
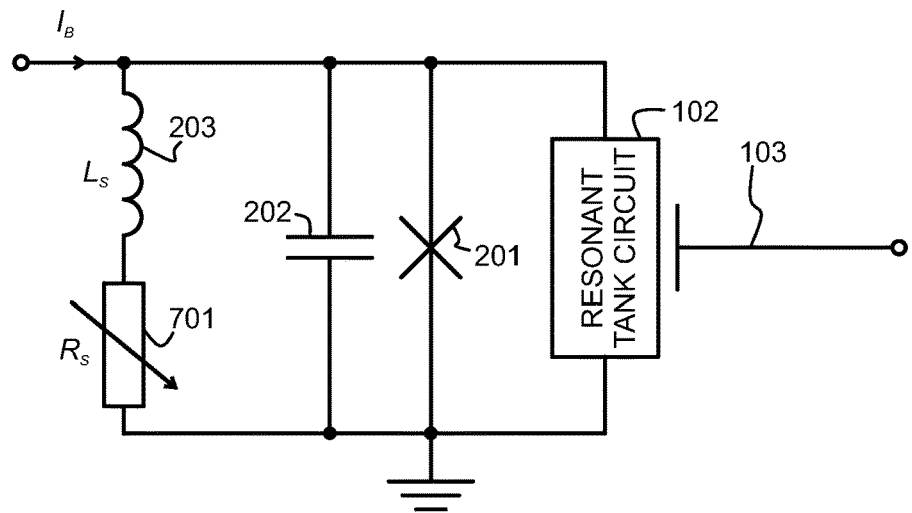
FIG. 7 is a schematic circuit diagram of the Josephson oscillator of FIG. 5.

FIG. 7 illustrates a microwave power source according to FIG. 5 or FIG. 6 in the form of a circuit diagram. Elements similar to those in FIG. 2 above are shown with the same reference designators. The variable resistance of the current path in the bias circuit is shown as the variable resistor 701 in FIG. 7.

Figure 4:
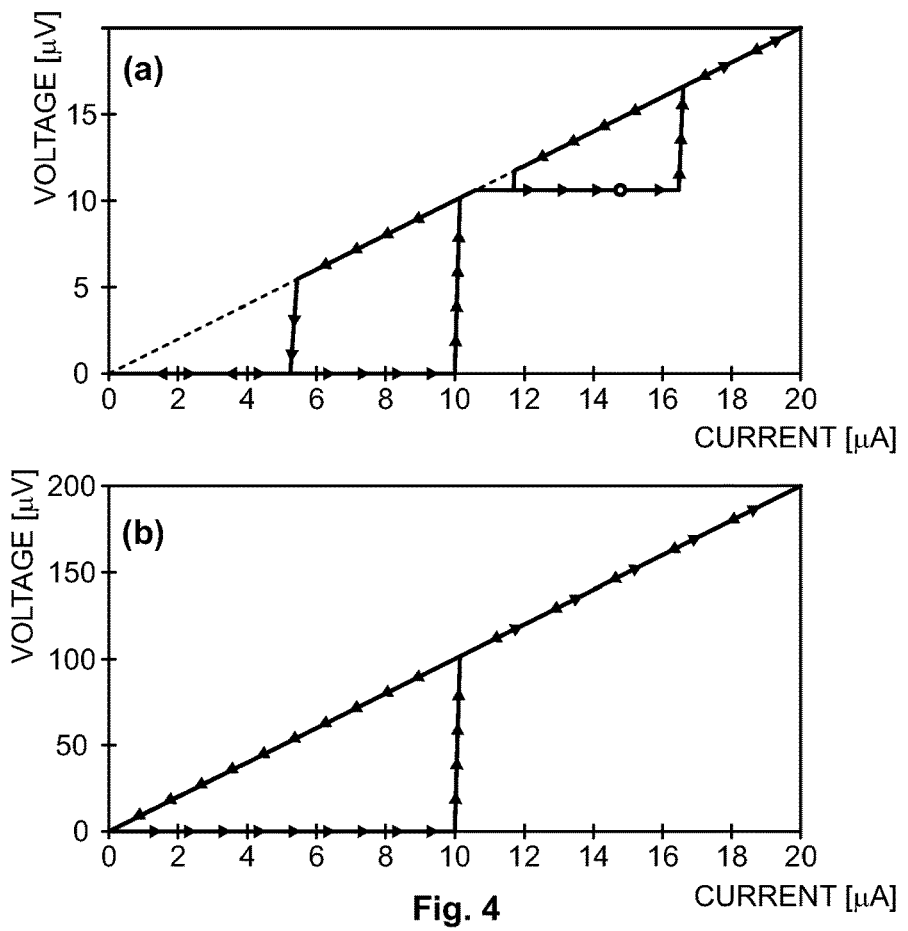
FIG. 4 illustrates I-V curves related to successful and unsuccessful biasing of a Josephson oscillator.
Figure 8:
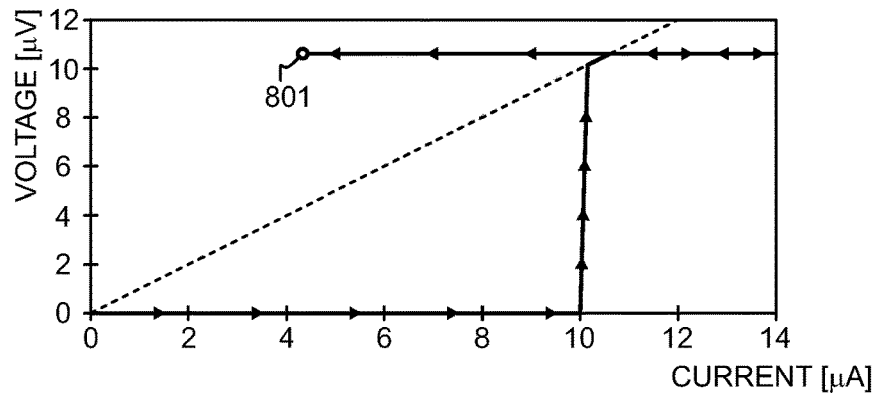
FIG. 8 illustrates an I-V curve of successfully biasing a Josephson oscillator for operation at high efficiency.

FIG. 8 shows the result of a simulation that was performed by keeping everything else the same as in the simulation that gave the upper graph of FIG. 4 but making the resistance $R_S$ variable. Its value was first kept constant at $R_S$=1Ω while the bias current was increased from zero to $I_B$=14 µA. As a result, those sections of the graph in FIG. 8 were observed where the arrowheads point to the right or up. After that, the bias current $I_B$ was swept downwards while simultaneously increasing $R_S$ to keep the junction current $\langle I_J\rangle$ constant (see equation (4) above for the expression of $\langle I_J\rangle$ and its dependence on $I_B$ and $R_S$). This part of the simulation gave the horizontal section of the graph in FIG. 8 on which the arrowheads point to the left. The value of $R_S$ was not increased above 1 kΩ, at which value point 801 of FIG. 8 was reached.

The operating point as required by the oscillator operation is essentially as defined by the junction current $\langle I_J\rangle$. Thus, as long as the junction current junction current $\langle I_J\rangle$ remains at a constant value, the device stays phase-locked despite the bias current $I_B$ sweeping downwards. A manifestation of the maintained phase-locked state is that the Shapiro step, on which the oscillator operation was first achieved, extends down to the new operating point 801 where $I_B$≈4 µA. Extrapolating from the simulation shown in FIG. 8, if a resistance value $R_S$=10 kΩ was reached, the efficiency at which microwave power was generated would be 99.97% as calculated from equation (6) above.

An intuitive explanation of the very high achievable efficiency is as follows. The junction current rent $\langle I_J\rangle$ is the DC tunnelling current through the Josephson junction tunnel element. With the resistance $R_S$ of the bias circuit increasing, $I_B$≈$\langle I_J\rangle$. In other words, the dissipation free tunnelling current becomes the sole bias current component.

In general terms, the variable resistance illustrated as $R_S$ and with reference designator 701 in FIG. 7 can be achieved by implementing the bias resistor as a controllable element. Such an implementation follows the approach shown schematically in FIG. 5. An alternative is to use a nonlinear shunt resistance, the value of which depends on the bias point, in conformity with FIG. 6.

According to an embodiment, the controllable or nonlinear bias circuit is located at the same temperature stage within the cryostat as the oscillator. According to another embodiment, the controllable or nonlinear bias circuit is located at a higher temperature stage within the cryostat as the oscillator. For example, the oscillator may be located at the base temperature stage (<100 mK) which is typical to quantum circuits that involve qubits, while the bias circuit may be located at the still stage (~1 K), or at one of the mechanically cooled stages (~4 K or ~70 K) of a cryostat equipped with a dilution refrigerator. According to yet another embodiment, the controllable or nonlinear bias circuit is located in the room temperature environment while the oscillator is located at a cryogenically cooled stage of the cryostat. The location of the various parts of the microwave power source may be decided taking into account the noise eminent from higher temperatures and practical aspects such as parasitic wiring resistance.

Some consideration may be given to the rate (ohms per unit of time) at which the resistance in the bias circuit is varied. In the simulations that produced the graph of FIG. 8, an assumption was that the resistance varies slowly, in the adiabatic limit, which ensures that the system maintains stable operation while $R_S$ changes. As long as the assumption of adiabaticity is valid, controlling the resistance and the current sweep may take place within relatively wide tolerances without risking the stable, phase-locked operation of the Josephson oscillator. In some cases, however, it may be desirable to be able to apply faster control. Conceptually, this would mean having a switch rather than a variable resistor in the bias circuit. For the purposes of this description, a switch and a variable resistor both serve to implement a current path of variable resistance between the bias input of the microwave power source and the reference potential.

The advantage of a switch, i.e. means for making a stepwise, almost momentary variation in the resistance of the current path, is speed. On the other hand, there may be disadvantages related to stochastic transients that may prevent stable oscillator operation or at least cause uncertainty in the operation. In order to mitigate such risks and to possibly achieving more reliable operation, it is possible to use a switch in combination with a low-pass filter in the bias circuit to smoothen the switching transient.

A microwave power source according to the general approach taken above can be designed to a wide range of output frequencies and powers, which is also reflected in the required impedance levels of the bias circuit. While the method of generating microwave signals this way (i.e. biasing the Josephson oscillator to an operating point on the original Shapiro step and subsequently increasing resistance on a current path used for said biasing) is generic, the technology to be chosen and the detailed design may vary considerably depending on many factors, such as the desired oscillator frequency and output power for example.

Figure 9:
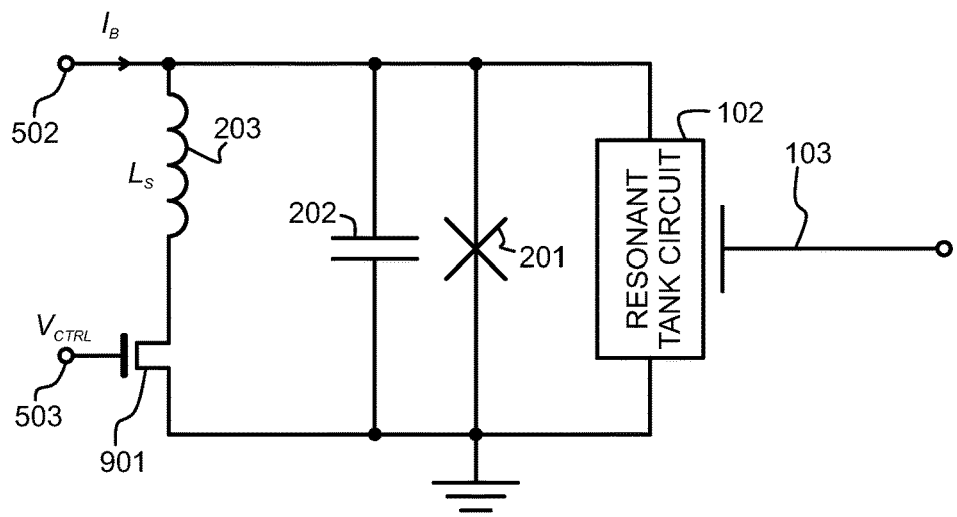
FIG. 9 is a schematic circuit diagram of a Josephson oscillator according to an embodiment.

FIG. 9 illustrates a microwave power source according to an embodiment. Here the control input 503 is a control voltage input. The controllable resistive element in the bias circuit comprises one or more transistors 901. The or each such transistor 901 has a current-carrying channel between respective two current-carrying electrodes. The or each such transistor 901 has also a control electrode, which is coupled to the control voltage input. In such an arrangement the potential of the control electrode defines the resistance of the current-carrying channel in the or each transistor 901.

The or each transistor may be for example a FET (field-effect transistor), a JFET (junction field-effect transistor), a MOSFET (metal-oxide semiconductor field-effect transistor), a HEMT (high electron mobility transistor), a BJT (bipolar junction transistor), a SET (single-electron transistor), or a SCPT (single Cooper pair transistor). These transistor types are examples of what can be used as continuous voltage-controlled resistances. Alternatively, they can be configured as switches, in accordance with the discussion above. For example, FETs, JFETs, HEMTs and the like function as gate-controlled tunable resistances at low drain-source voltages. This is likely a compliant characteristic for the voltage levels of typical Josephson oscillators such as those mentioned earlier in this text. HEMTs are frequently used in cryogenic applications due to their good compatibility with low-temperature operation.

As an alternative or addition to using a transistor in the bias circuit, it is possible to us other kinds of circuit elements to implement the variable resistance. One possibility is to utilize a SQUID or a SQUID array. A the critical current of a SQUID (or a SQUID array) can be tuned by using a controlled magnetic flux, which in turn can be realized with an inductance that has a mutual coupling with the SQUID loop (s), the resistance across a coupling involving the SQUID or SQUID array can be tuned, for a given bias current, between zero and a finite value. By using over-damped SQUIDs, such as externally shunted SQUIDs or SQUIDS based on SNS (superconductor-normal metal-superconductor) junctions, the resistance can also be continuously tuned. SQUID-based solutions have the advantage of large similarity with the Josephson oscillator regarding many steps of the manufacturing process. This may have advantageous effects concerning on-chip integration. An additional (constant) resistance can be applied in any SQUID-based implementation of the bias circuit to provide a minimum resistance, if needed.

Figure 10:
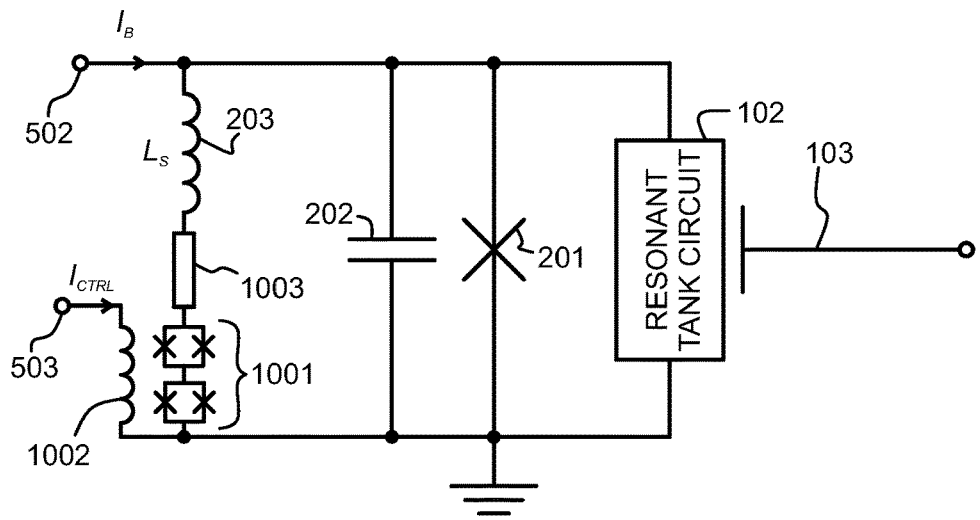
FIG. 10 is a schematic circuit diagram of a Josephson oscillator according to an embodiment.

FIG. 10 illustrates a microwave power source according to an embodiment. In this embodiment, the control input 503 is a control current input. The controllable resistive element on the current path of the bias circuit is a SQUID array 1001, a critical current of which is responsive to the value of control current brought to the control current input 503. In particular, a magnetic-flux-inducing inductance 1002 is coupled between the control current input 503 and the reference (ground) potential. The magnetic-flux-inducing inductance 1002 is located close enough to the SQUID array 1001 so that a current through the magnetic-flux-inducing inductance 1002 affects the magnetic flux that penetrates the loops in the SQUID array 1001.

The microwave power source shown in FIG. 10 comprises also a (constant) series resistance 1003 coupled in series with the SQUID array 1001. As such, a series resistance of this kind could also be coupled in series with the (one or more) transistor (s) used in embodiments like that of FIG. 9. A series resistance, if used, ensures that the resistance of the bias current path does not go below a predetermined minimum limit under any circumstances.

Figure 11:
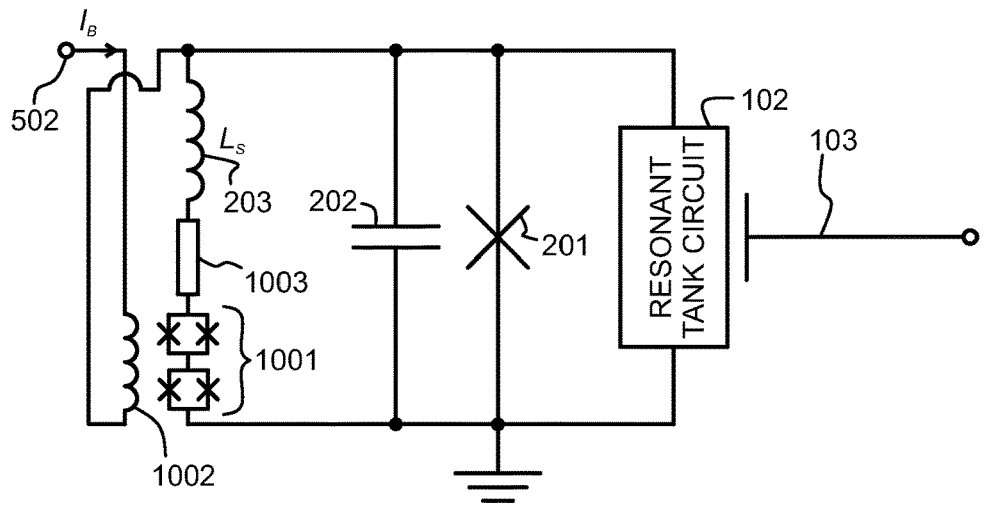
FIG. 11 is a schematic circuit diagram of a Josephson oscillator according to an embodiment.
Figure 12:
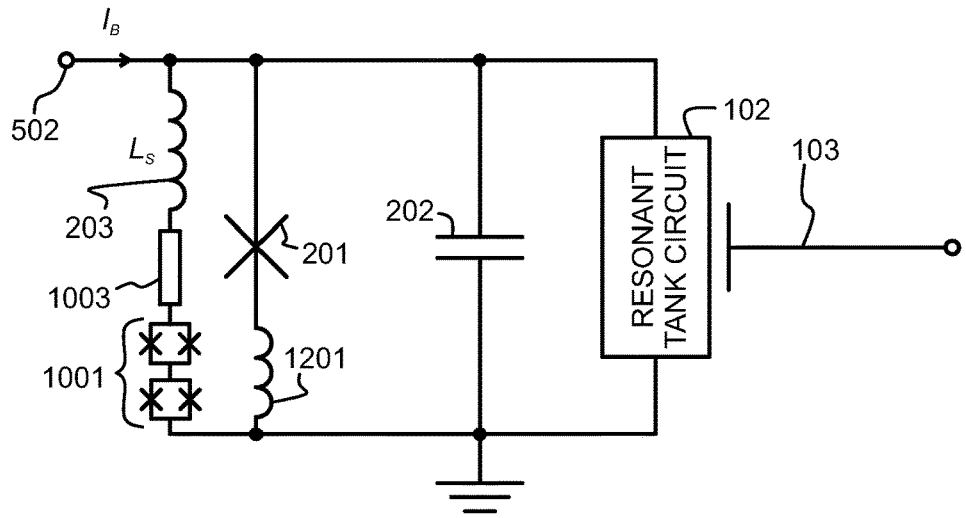
FIG. 12 is a schematic circuit diagram of a Josephson oscillator according to an embodiment.

FIGS. 11 and 12 illustrate examples of microwave power sources in which the resistance of the current path in the bias circuit is responsive to the value of a bias signal (or a component of a bias signal) brought to the bias input 502. A benefit of such an approach is that one less control quantity is needed, but this comes at the cost of making is somewhat more challenging to engineer the system as the resistance control cannot be engineered independently of the bias requirements of the oscillator.

In the embodiment of FIG. 11, the bias current is used to control the variable resistance in the bias circuit. The microwave power source of FIG. 11 comprises a SQUID array 1001 on the current path in the bias circuit, much like in the embodiment of FIG. 10. Coupled between the bias input 502 and the Josephson junction 201, the microwave power source of FIG. 11 comprises an inductance 1002 that is inductively coupled to the SQUID array 1001. Similar to FIG. 10, there is a series resistance 1003 coupled in series with the SQUID array 1001, but this is not a necessary requirement if the resistance properties of the bias circuit can otherwise be ensured to fulfil the appropriate criteria.

The embodiment of FIG. 12 differs from that of FIG. 11 in that the magnetic-flux-inducing inductance 1201 is coupled between the Josephson junction 201 and the reference potential. In embodiments like those in FIGS. 11 and 12, the SQUID or SQUID array is to be engineered so that the resistance dependence of the bias circuit of the bias current is favourable as required by the operation described earlier in this text. This can be achieved with proper design of the critical current of the junctions in the SQUID (s) and proper design of the mutual inductance between the SQUID (s) and the magnetic-flux-inducing inductance.

Various combinations of the approaches of FIGS. 11 and 12 are possible; the control current through the magnetic-flux-inducing inductance can be the current flowing in the bias circuit, or the current through the Josephson junction, or a combination of these.

According to yet another embodiment, the microwave power source comprises a nonlinear resistive element on the current path in the bias circuit. Such a nonlinear resistive element, if used, should have a resistance that is inversely dependent of the value of current therethrough. No mathematically exact inverse dependence or inverse proportionality is meant here. In the optimal case, the nonlinear resistive element should have a large resistance at the desired operating point (i.e. small bias current) but a low resistance at somewhat higher bias current values. The threshold between such two resistance values (or ranges) should be at the bias range compatible to the bias parameters of the Josephson oscillator. Then, ideally, the resistance of the nonlinear resistive element would follow qualitatively a trend similar to that explained earlier in this text with reference to FIG. 8.

Figure 13:
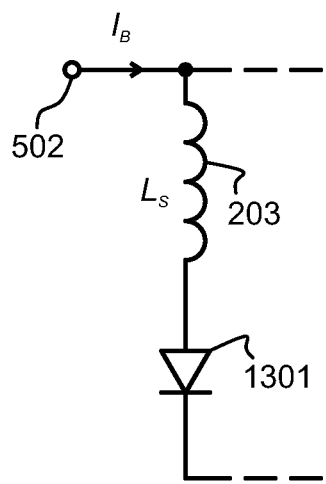
FIG. 13 is a schematic circuit diagram of a bias circuit according to an embodiment.
Figure 14:
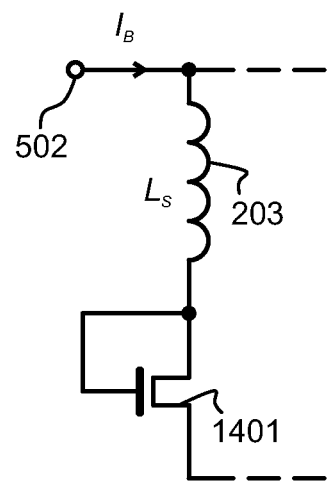
FIG. 14 is a schematic circuit diagram of a bias circuit according to an embodiment.
Figure 15:
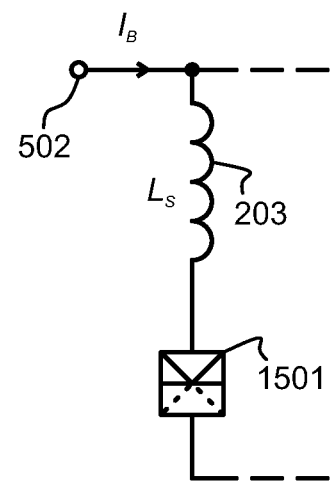
FIG. 15 is a schematic circuit diagram of a bias circuit according to an embodiment.

FIGS. 13 to 15 illustrate examples of bias circuits with nonlinear resistive elements. In FIG. 13, the nonlinear resistive element is a diode 1301; in FIG. 14 it is a diode-connected transistor 1401; and in FIG. 15 it is a tunnel junction 1501 containing at least one superconducting electrode. Combinations of such nonlinear resistive elements could be used. In the case of FIG. 15, the tunnel junction 1501 may be for example a NIS (normal metal-insulator-superconductor) junction or a SINIS (superconductor-insulator-normal metal-insulator-superconductor) junction. It may be possible to choose the superconducting electrode material with its gap in the order of the oscillator operating voltage value $V=(h/2e)f$. For example, the aluminium gap of about 200 microvolts corresponds to a frequency of about 100 GHz. If the corresponding frequency is too high, it may be possible to suppress the gap through the proximity effect from the normal metal conductors, i.e. by placing one or more pieces of normal metal in contact with the superconducting electrode (s) of the tunnel junction (s), in the vicinity of the tunnel junction. This would enable tuning the nonlinearity for a given oscillator frequency range.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:
1. A microwave power source, comprising:
a Josephson junction or junction array,
a resonant tank circuit coupled to the Josephson junction or junction array and configured to resonate at one or more frequencies of Josephson oscillation generated in the Josephson junction or junction array,
an output coupler coupled to said resonant tank circuit for outputting microwave power from said resonant tank circuit, and
a bias circuit coupled to the Josephson junction or junction array and configured to produce a bias voltage across the Josephson junction or junction array;
wherein:
said bias circuit comprises a current path of variable resistance between a bias input of the microwave power source and a reference potential;
the bias circuit comprises a control input, separate from said bias input, and
the bias circuit comprises a controllable resistive element on said current path, a resistance of said controllable resistive element being responsive to a value of a control signal brought to said control input.

2. The microwave power source according to claim 1, wherein:
said control input is a control voltage input, and
said controllable resistive element comprises one or more transistors, each with a respective current-carrying channel between respective two current-carrying electrodes and with a respective control electrode coupled to said control voltage input, so that a potential of the control electrode defines the resistance of said current-carrying channel in each of said one or more transistors.

3. The microwave power source according to claim 2, wherein each of said one or more transistors is one of: a field-effect transistor, a junction field-effect transistor, a metal-oxide semiconductor field-effect transistor, a high electron mobility transistor, a bipolar junction transistor, a single-electron transistor, a single Cooper pair transistor.

4. The microwave power source according to claim 2, comprising a series resistance coupled in series with said one or more transistors, SQUID, or SQUID array on said current path.

5. The microwave power source according to claim 1, wherein:
said control input is a control current input, and
said controllable resistive element is a SQUID or SQUID array on said current path, a critical current of said SQUID or SQUID array being responsive to a value of control current brought to said control current input.

6. The microwave power source according to claim 1, wherein the resistance of said current path is responsive to a value of a bias signal or component of the bias signal brought to said bias input.

7. The microwave power source according to claim 6, wherein:
said current path comprises a SQUID or SQUID array, and
the microwave power source comprises, coupled between said bias input and said Josephson junction or junction array, an inductance inductively coupled to said SQUID or SQUID array.

8. The microwave power source according to claim 6, wherein:

the microwave power source comprises a nonlinear resistive element on said current path, said nonlinear resistive element having a resistance that is inversely dependent of a value of current therethrough.

9. The microwave power source according to claim 8, wherein said nonlinear resistive element comprises at least one of: diode, diode-connected transistor, tunnel junction containing at least one superconducting electrode.

10. The microwave power source according to claim 9, wherein:

said nonlinear resistive element comprises at least one of: a normal metal-insulator-superconductor junction, a superconductor-insulator-normal metal-insulator-superconductor junction.

11. A method for generating microwave signals, comprising:

biasing a Josephson oscillator to an operating point on an original Shapiro step with an upwards sweep of bias current brought to a bias input of the Josephson oscillator, subsequently increasing a resistance on a current path used for said biasing, causing said operating point to migrate onto an extension of said original Shapiro step at smaller bias current values, and utilizing Josephson oscillations coupled out of a resonant tank circuit of said Josephson oscillator as the generated microwave signal.

12. The method according to claim 11, wherein said increasing of said resistance is accomplished by changing a value of a control signal brought to a controllable resistance on said current path.

13. The method according to claim 11, wherein said increasing of said resistance is accomplished by changing a value of a bias current used for said biasing.

* * * * *